United States Patent [19]

Watanabe et al.

[11] Patent Number: 4,790,014
[45] Date of Patent: Dec. 6, 1988

[54] LOW-PITCHED SOUND CREATOR

[75] Inventors: Koji Watanabe; Katsuhiko Hayashi; Nobuaki Minakuchi, all of Osaka; Masayuki Misaki, Kyoto; Kenichi Terai, Osaka; Yasutoshi Nakama, Ikoma; Masaharu Morita, Osaka, all of Japan

[73] Assignee: Matsushita Electric Industrial Co., Ltd., Osaka, Japan

[21] Appl. No.: 30,910

[22] Filed: Mar. 30, 1987

[30] Foreign Application Priority Data

| Apr. 1, 1986 | [JP] | Japan | 61-74778 |
| Aug. 11, 1986 | [JP] | Japan | 61-188143 |
| Oct. 17, 1986 | [JP] | Japan | 61-247808 |
| Dec. 26, 1986 | [JP] | Japan | 61-312190 |
| Feb. 19, 1987 | [JP] | Japan | 62-36105 |

[51] Int. Cl.$^4$ ............................................. H04S 1/00
[52] U.S. Cl. ......................................... 381/1; 381/56; 381/98

[58] Field of Search ................... 84/1.01, 1.19, 1.24, 84/1.21, 1.23; 381/1, 56, 98, 118

[56] References Cited

U.S. PATENT DOCUMENTS

| 3,213,180 | 10/1965 | Cookerly | 84/1.19 |
| 3,535,969 | 10/1970 | Burger | 84/1.19 |
| 4,182,930 | 1/1980 | Blackmer | 381/28 |
| 4,698,842 | 10/1987 | Mackie et al. | 381/98 |

Primary Examiner—Forester W. Isen
Attorney, Agent, or Firm—Lowe, Price, LeBlanc, Becker & Shur

[57] ABSTRACT

An analog sound signal is outputted. Low-frequency components are selected from the outputted analog sound signal so that a low-pitched sound signal is derived from the analog sound signal. A key of the low-pitched sound signal is lowered so that a very-low-pitched sound signal is derived from the low-pitched sound signal. The analog sound signal and the very-low-pitched sound signal may be converted into corresponding sounds respectively.

8 Claims, 9 Drawing Sheets

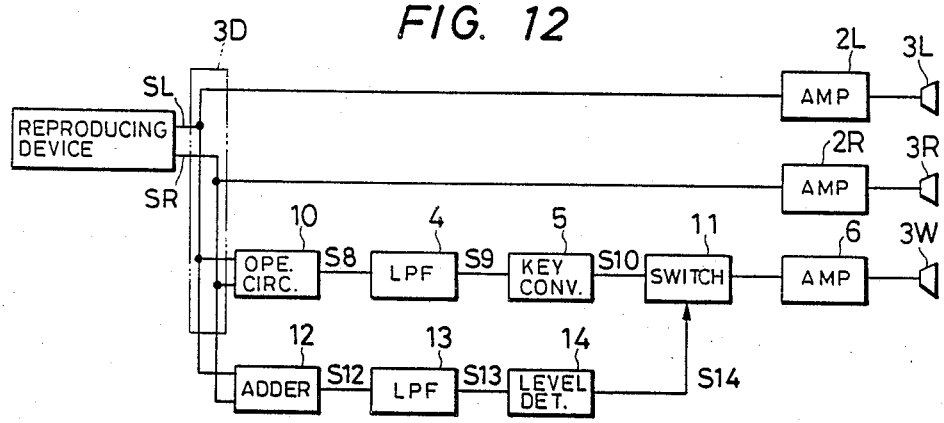
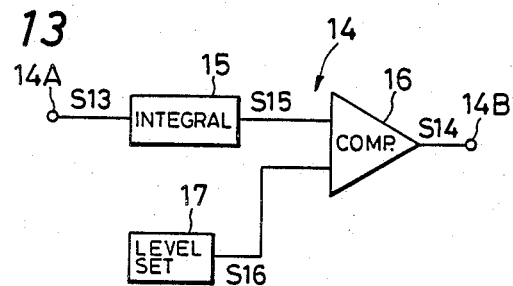
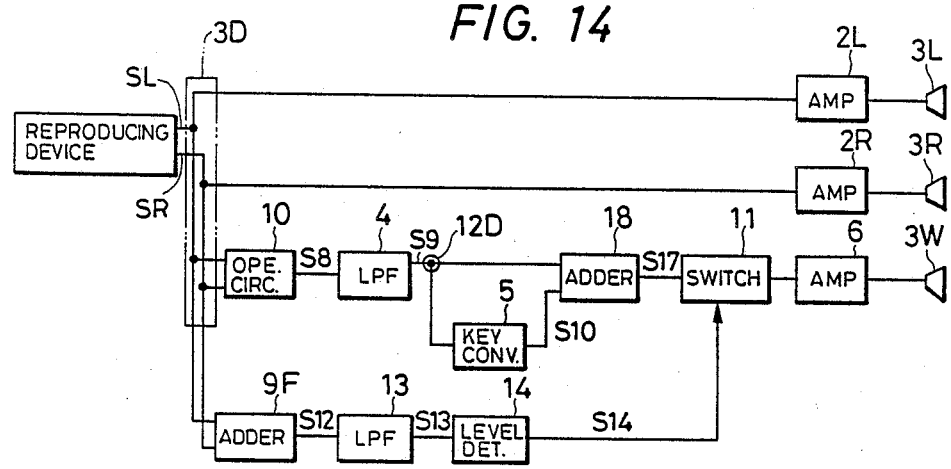

LOW-PITCHED SOUND CREATOR

BACKGROUND OF THE INVENTION

This invention relates to a low-pitched sound creator which can improve an aural sensation in low-pitched sound reproduced by an audio system, an audio-visual system, or the like. This invention also relates to a method of creating a low-pitched sound.

Some sound reproducing devices have a head deriving and reproducing a sound signal from sound data stored in a magnetic memory such as a magnetic tape. Reproducing heads have characteristics causing low-pitched sound cut-off frequencies. Specifically, these heads fail to acceptably reproduce original sound signals in frequency ranges below such cut-off frequencies.

Advanced sound reproducing systems have an additional function of compensating for poor low-pitched sound reproducing characteristics of heads.

SUMMARY OF THE INVENTION

It is an object of this invention to provide a low-pitched sound creator or a sound signal processing device which can improve an aural sensation in low-pitched sound reproduced by an audio system, an audio-visual system, or the like.

It is another object of this invention to provide a method which allows an excellent aural sensation in low-pitched sound.

In a low-pitched sound creator according to a first aspect of this invention, an analog sound signal is outputted. Low-frequency components are selected from the outputted analog sound signal so that a low-pitched sound signal is derived from the analog sound signal. A key of the low-pitched sound signal is lowered so that a very-low-pitched sound signal is derived from the low-pitched sound signal. The analog sound signal and the very-low-pitched sound signal may be converted into corresponding sounds respectively.

In a low-pitched sound creator according to a second aspect of this invention, two channel sound signals are outputted. A subtraction between the two channel signals is derived and thereby a subtraction signal indicative thereof is generated. The two channel signals are added to form a mixed signal. A first low-pass filter selects low-frequency components from the subtraction signal and thereby generates a first low-pitched sound signal representing the selected low-frequency components of the subtraction signal. A second low-pass filter selects low-frequency components from the mixed signal and thereby generates a second low-pitched sound signal representing the selected low-frequency components of the mixed signal. A key of the first low-pitched sound signal is lowered so that a very-low-pitched sound signal is derived from the first low-pitched sound signal. An envelope of the second low-pitched sound signal is detected. The very-low-pitched sound signal is selectively passed and cut off in accordance with the detected envelope.

In a low-pitched sound creator according to a third aspect of this invention, an analog sound signal is outputted. First and second low-pass filters having different cut-off frequencies derive first and second low-pitched sound signals from the analog sound signal respectively. Arbitrary one of the first and second low-pitched sound signals is selected. A key of the selected low-pitched sound signal is halved so that a key-halved signal is derived from the selected low-pitched sound signal.

In a low-pitched sound creator according to a fourth aspect of this invention, two channel sound signals are outputted. A subtraction between the two channel signals is derived and thereby a subtraction signal indicative thereof is generated. The two channel signals are added to form a mixed signal. A device detects whether or not the two channel signals contain voice components. Arbitrary one of the subtraction signal and the mixed signal is selected in accordance with whether or not the two channel signals contain voice components, and a selected signal representing the selected one of the subtraction signal and the mixed signal is generated. A low-pass filter selects low-frequency components from the selected signal and thereby generates a low-pitched sound signal representing the selected low-frequency components. A key of the low-pitched sound signal is halved so that a very-low-pitched sound signal is derived from the low-pitched sound signal.

In a method of creating a low-pitched sound according to a fifth aspect of this invention, low-frequency components are selected from a sound signal. A key of the selected low-frequency components is lowered. The key-lowered components are converted into a corresponding sound.

BRIEF DESCRIPTION OF THE DRAWINGS

FIG. 12 is a block diagram of an audio system including a low-pitched sound creator according to a sixth embodiment of this invention.

FIG. 13 is a block diagram of an internal structure of the level determination circuit of FIG. 12.

FIG. 14 is a block diagram of an audio system including a low-pitched sound creator according to a seventh embodiment of this invention.

Like and corresponding elements are usually denoted by the same reference characters throughout the drawings.

DESCRIPTION OF THE PREFERRED EMBODIMENTS

Before embodiments of this invention will be explained, conventional audio systems will be described briefly for a better understanding of this invention.

Figure 1:
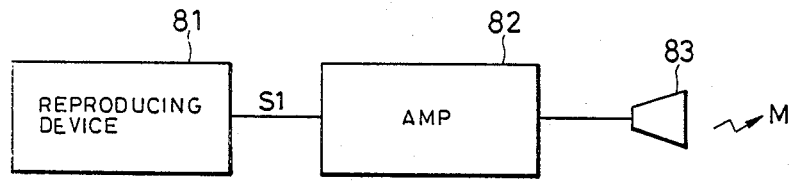
FIG. 1 is a block diagram of a conventional audio system.

FIG. 1 shows a conventional audio system having a reproducing device 81 such as a tape deck or a radio receiver. An output signal S1 from the reproducing device 81 is magnified by an amplifier 82 and is then converted by a loudspeaker 83 into a corresponding sound M.

Figure 2:
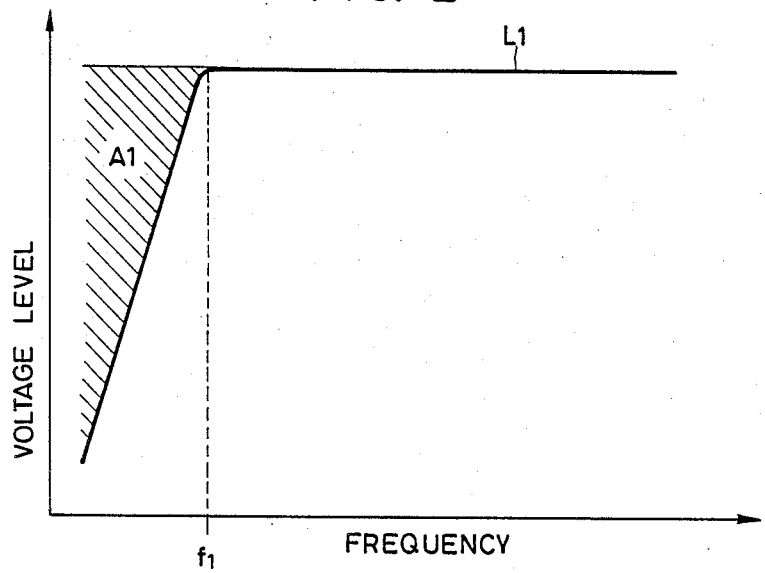
FIG. 2, is a graph showing frequency characteristics of the reproducing device of FIG. 1.

The tape deck 81 has a head deriving and reproducing a sound signal S1 from sound data stored in a magnetic tape or the like. FIG. 2 shows frequency characteristics of the tape deck 81 which deeend mainly on frequency characteristics of the reproducing head. In FIG. 2, the voltage level of the sound signal S1 varies as a function of the frequency of the sound signal S1 along the line L1. At frequencies above a low-pitched sound cut-off frequency f1, the tape deck 81 has essentially flat frequency characteristics. As the frequency decreases from the cut-off value f1, the level of the sound signal S1 drops. The hatched area A1 denotes an unproduced range having frequencies below the cut-off frequency f1.

As is understood from FIG. 2, the conventional audio system of FIG. 1 can not acceptably reproduce sounds having frequencies lower than the cut-off frequency f1.

Figure 3:
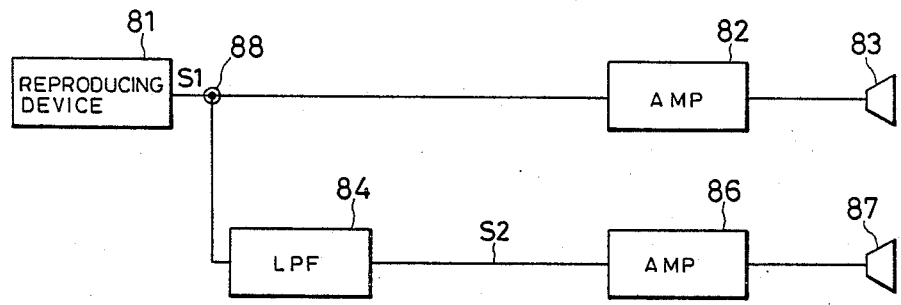
FIG. 3 is a block diagram of another conventional audio system.

FIG. 3 shows another conventional audio system also having a reproducing device 81. An output signal S1 from the reproducing device 81 is applied via a branching device 88 to an amplifier 82 and a low-pass filter (LPF) 84. After the sound signal S1 is amplified by the device 82, it is converted into a corresponding sound by a loudspeaker 83. The low-pass filter 84 derives a low-pitched sound signal S2 from the sound signal S1. For example, the low-pitched sound signal S2 have frequencies equal to or below 150 Hz. After the low-pitched sound signal S2 is magnified by an amplifier 86, it is converted into a corresponding sound by a loudspeaker 87.

The conventional audio system of FIG. 3 can compensate for poor low-pitched sound reproducing characteristics of the reproducing device 81 to some extents. If an original sound signal fails to have low-frequency components, sounds reproduced by the audio system of FIG. 3 will not have corresponding low-pitched components.

Figure 4:
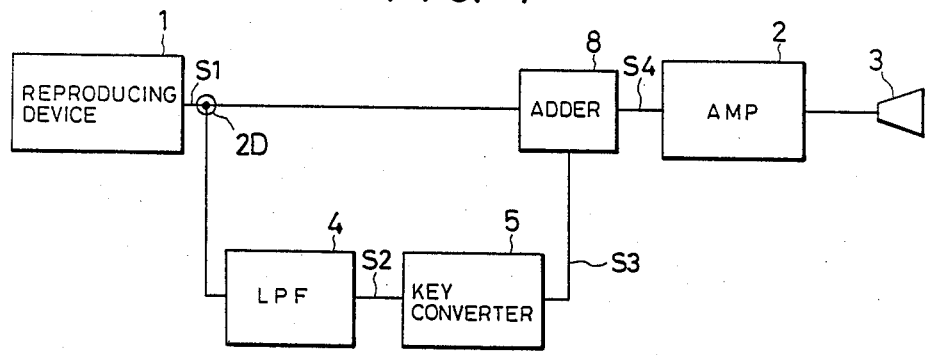
FIG. 4 is a block diagram of an audio system including a low-pitched sound creator according to a first embodiment of this invention.

FIG. 4 shows an audio system including a low-pitched sound creator according to a first embodiment of this invention. As shown in FIG. 4, the audio system has a reproducing device 1 such as a tape deck or a radio receiver. An output terminal of the reproducing device 1 is connected to an input terminal of a branching device 2D. A first output terminal of the branching device 2D is connected to a first input terminal of an adder 8. A second output terminal of the branching device 2D is connected to an input terminal of a low-pass filter (LPF) 4. An output signal S1 from the reproducing device 1 is applied via the branching device 2D to the first input terminal of the adder 8 and to the input terminal of the low-pass filter 4.

The low-pass filter 4 selects low-frequency components from the sound signal S1 and thereby derives a low-pitched sound signal S2 from the signal S1. A cut-off frequency of the low-pass filter 4 is preferably around 150 Hz. An output terminal of the low-pass filter 4 is connected to an input terminal of a key or pitch converter 5 so that the output signal S2 from the low-pass filter 4 is applied to the key converter 5. The key converter 5 serves as a frequency lowering converter. Thus, the key converter 5 lowers the frequencies or pitches of the signal S2 outputted by the low-pass filter 4. Preferably, this device 5 converts the low-pitched sound signal S2 into a second low-pitched sound signal S3 having frequencies half the respective frequencies of the corresponding sound signal S2. In other words, the low-frequency components of the sound signal S1 selected by the low-pass filter 4 are lowered in frequency by a value corresponding to an octave. In this way, a very-low-pitched sound signal S3 is derived from the low-pitched sound signal S2.

It should be noted that the key converter 5 may decrease the frequencies of the low-pitched sound signal S2 by other factors. For example, the frequencies of the very-low-pitched sound signal S3 may be one-third or one-fourth of the respective frequencies of the low-pitched sound signal S2.

An output terminal of the key converter 5 is connected to a second input terminal of the adder 8 so that the very-low-pitched sound signal S3 is applied to the second input terminal of the adder 8. The sound signal S1 and the very-low-pitched sound signal S3 are added by the device 8 to form a processed or modified sound signal S4. An output terminal of the adder 8 is connected to an input terminal of an amplifier 2 so that the modified sound signal S4 is applied to the amplifier 2. An output terminal of the amplifier 2 is connected to a loudspeaker 3. After the modified sound signal S4 is amplified by the device 2, it is converted into a corresponding sound by the loudspeaker 3.

Figure 5:
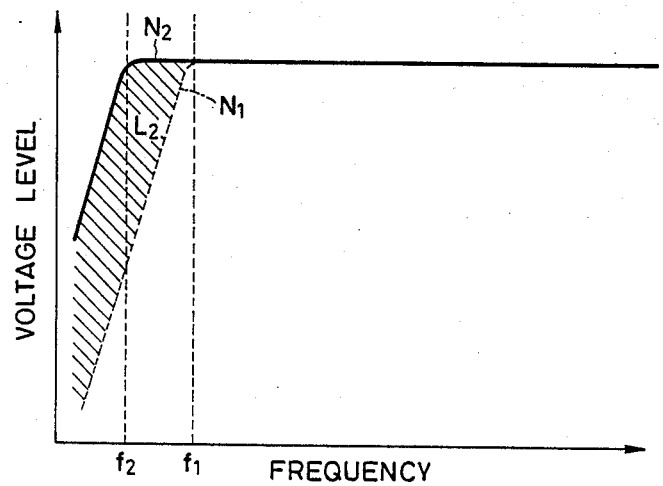
FIG. 5 is a graph showing frequency characteristics of the reproducing device and the audio system of FIG. 4.

FIG. 5 shows frequency characteristics of the reproducing device 1 and frequency characteristics of the audio system of FIG. 4. In FIG. 5, the broken line N1 denotes low frequency characteristics of the reproducing device 1, while the solid line N2 denotes low frequency characteristics of the audio system of FIG. 4. The hatched area L2 between the lines N1 and N2 denotes an added low-frequency reproduced range created by the sound signal processing through the key converter 5. A low cut-off frequency f2 in the frequency characteristics of the audio system of FIG. 4 is lower than a low cut-off frequency f1 in the frequency characteristics of the reproducing device 1 by a value corresponding to an octave. The added low-frequency reproduced range L2 improves an aural sensation in respect of low-pitched sounds. Furthermore, even in cases where sound signals lack very-low-frequency components, e.g., even in the case of an AM radio broadcasting sound signal or a movie sound signal, the sound signal processing through the key converter 5 creates very-low-frequency components from a base sound signal and adds them to the base sound signal to form a modified sound signal rich in low-frequency components, so that an excellent aural sensation is allowed in respect of low-pitched sounds.

Figure 6:
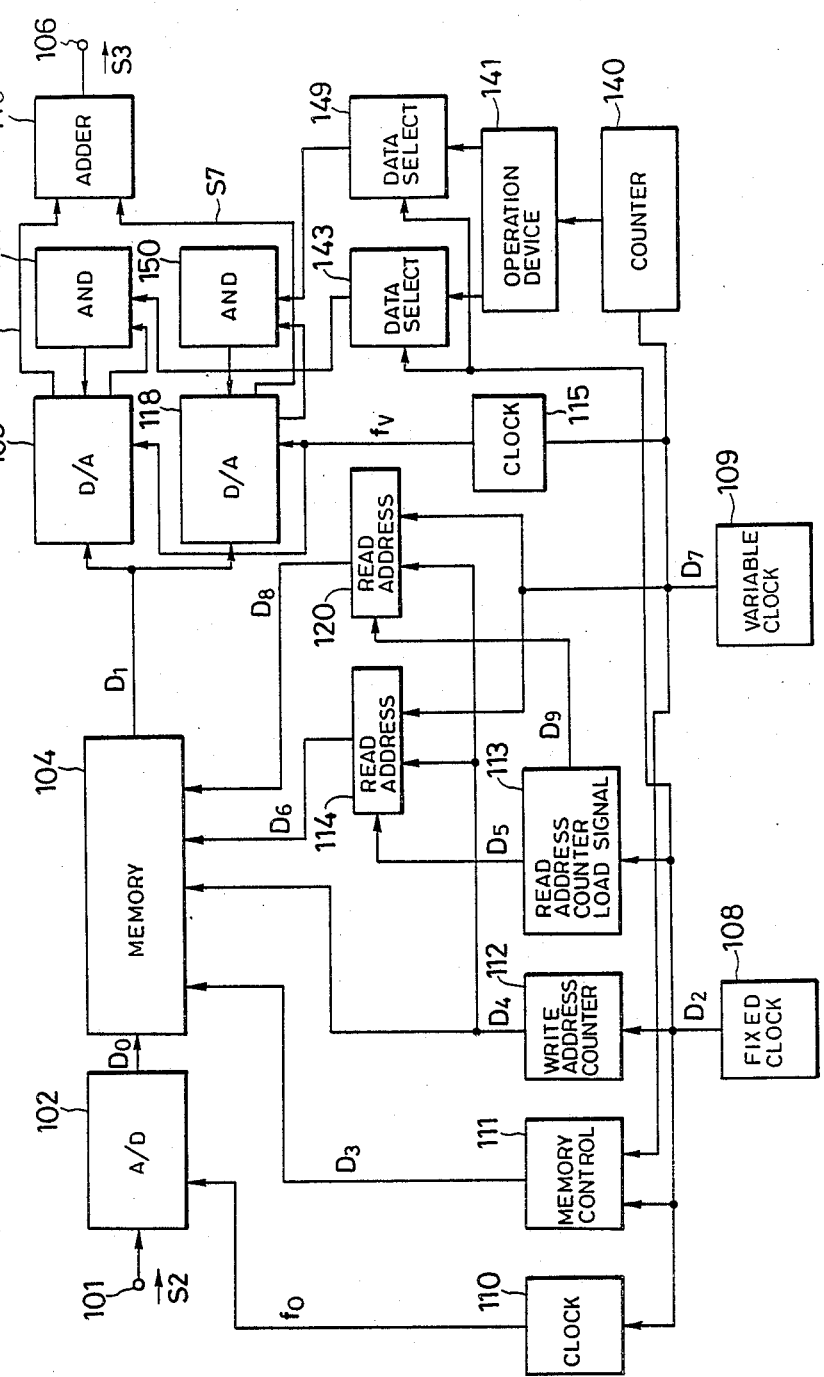
FIG. 6 is a block diagram of an internal structure of the key converter of FIG. 4.

FIG. 6 is a block diagram of an internal structure of the key converter 5. As shown in FIG. 6, the key converter 5 has an input terminal 101 subjected to a low-pitch sound signal S2 outputted by the low-pass filter 4 (see FIG. 4). An analog-to-digital (A/D) converter 102 derives a one-bit digital signal D0 from the input analog signal S2 through adaptive delta modulation. This adaptive delta modulation uses a syllable compander which depends on whether or not four successive one-bit digital signals are in the same state. A dynamic random-access memory 104 holds the digital signal D0. A first digital-to-analog (D/A) converter 105 derives an analog signal S6 from a one-bit digital signal D1 outputted by the memory 104. A second digital-to-analog (D/A) converter 118 derives an analog signal S7 from a one-bit digital signal D1 outputted by the memory 104. An adder 116 derives a very-low-pitched sound signal S3 from the analog signals S6 and S7 outputted by the D/A converters 105 and 118. Specifically, the analog signals S6 and S7 from the D/A converters 105 and 118 are added by the device 116 to form a very-low-pitched sound signal S3. The very-low-pitched sound signal S3 is transmitted to an output terminal 106 of the key converter 5.

A generator 108 outputs clock pulses D2 at a fixed frequency. A generator 110 derives conversion clock pulses f0 from the fixed-frequency clocks D2. The conversion clocks f0 are applied to the A/D converter 102. The A/D converter 102 samples and converts the low-pitched sound signal S2 at timings determined by the conversion clocks f0.

Operation of the digital memory 104 is controlled in accordance with various signals including a row address strobe (RAS) signal, a column address strobe (CAS) signal, a write enable (WE) signal, a write address signal, and a read address signal.

A write address counter 112 derives a signal D4 from the fixed-frequency clocks D2. This signal D4 represents a write address. The write address signal D4 is applied to the memory 104. The current incoming digital signal D0 is transmitted to and held by a segment of the memory 104 corresponding to the address represented by the write address signal D4.

A generator 109 outputs clock pulses D7 at a variable frequency. A generator 111 derives a memory control signal D3 from the fixed-frequency clocks D2 and the variable-frequency clocks D7. The memory control signal D3 is applied to the memory 104. Specifically, the memory control signal D3 includes the RAS signal, the CAS signal, and the WE signal.

A generator 113 derives write address counter load signals D5 and D9 from the fixed-frequency clocks D2. A first read address counter 114 derives a signal D6 from the write address signal D4, the read address counter load signal D5, and the variable-frequency clocks D7. This signal D6 represents a first read address. The first read address signal D6 is applied to the memory 104. Data is read out from a segment of the memory 104 corresponding to the first read address represented by the signal D6. A second read address counter 120 derives a signal D8 from the write address signal D4, the read address counter load signal D9, and the variable-frequency clocks D7. This signal D8 represents a second read address. The second read address signal D8 is applied to the memory 104. Data is read out from a segment of the memory 104 corresponding to the second read address represented by the signal D8. The first read address signal D6 and the second read address signal D8 are generally designed to occur alternately at regular intervals.

A generator 115 derives conversion clock pulses fv from the variable-frequency clocks D2. The conversion clocks fv are applied to the D/A converters 105 and 118. The D/A converters 105 and 118 sample and convert the memory output digital signal D1 at timings determined by the conversion clocks fv.

Data writing to the memory 104 is performed periodically at a frequency determined by the fixed-frequency clocks D2. Data reading from the memory 104 is performed periodically at a frequency determined by the variable-frequency clocks Fv. The ratio between the pitches of the key-converter input and output signals S2 and S3 is generally proportional to the ratio between the frequencies of the data writing and reading.

A counter 140 derives an amplitude operation signal from the variable-frequency clocks D7. The amplitude operation signal is applied to an operation device 141. The operation device 141 derives first and second multi-bit digital signals from the amplitude operation signal. The first multi-bit signal from the operation device 141 is applied to a first data selector 143. The second multi-bit signal from the operation device 141 is applied to a second data selector 149. The fixed-frequency clocks D2 are applied to the data selectors 143 and 149. The first data selector 143 sequentially selects one bit data of the first multi-bit signal from the calculation device 141 in accordance with the fixed-frequency clocks D2. The second data selector 149 sequentially selects one bit data of the second multi-bit signal from the calculation device 141 in accordance with the fixed-frequency clocks D2.

The output signal from the first data selector 143 is applied to a first input terminal of an AND gate 144. The first D/A converter 105 includes a circuit deriving or detecting a syllable compander digital signal. This compander signal generated in the first D/A converter 105 is applied to a second input terminal of the AND gate 144. A signal outputted by the AND gate 144 is applied to the first D/A converter 105. The first D/A converter 105 also includes a circuit adjustably controlling or limiting the amplitude of the output signal S6. The signal fed to the first D/A converter 105 from the AND gate 144 adjusts the limiting circuit so that the amplitude of the signal S6 is controlled in accordance with the signal from the AND gate 144.

The output signal from the second data selector 149 is applied to a first input terminal of an AND gate 150. The second D/A converter 118 includes a circuit deriving or detecting a syllable compander digital signal. This compander signal generated in the second D/A converter 118 is applied to a second input terminal of the AND gate 150. A signal outputted by the AND gate 150 is applied to the second D/A converter 118. The second D/A converter 118 also includes a circuit adjustably controlling or limiting the amplitude of the output signal S7. The signal fed to the second D/A converter 118 from the AND gate 150 adjusts the limiting circuit so that the amplitude of the signal S7 is controlled in accordance with the signal from the AND gate 150.

The amplitude controls of the signals S6 and S7 are designed to remove or prevent noises caused by discontinuities in waveforms occurring during sound pitch changing process. In general, such noises occur at known regular timings. In view of this fact, the combination of the devices 140, 141, 143, 144, 149, and 150 performs the amplitude controls of the signals S6 and S7 in time-dependent manner.

The output signal S6 from the first D/A converter 105 is periodically enabled and nullified. The output signal S7 from the second D/A converter 118 is periodically enabled and nullified. Approximately, the signal S6 is enabled but the signal S7 is nullified during a first period, and the signal S6 is nullified but the signal S7 is enabled during a subsequent second period. Near the boundary between the first and second periods, the amplitudes of the signals S6 and S7 are controlled in a cross fade-in/fade-out manner. Specifically, near the boundary between the first and second periods, one of the signals S6 and S7 is gradually enabled while the other is gradually nullified. These controls of the signals S6 and S7 are realized through the amplitude controls by the combination of the devices 140, 141, 143, 144, 149, and 150.

Figure 7:
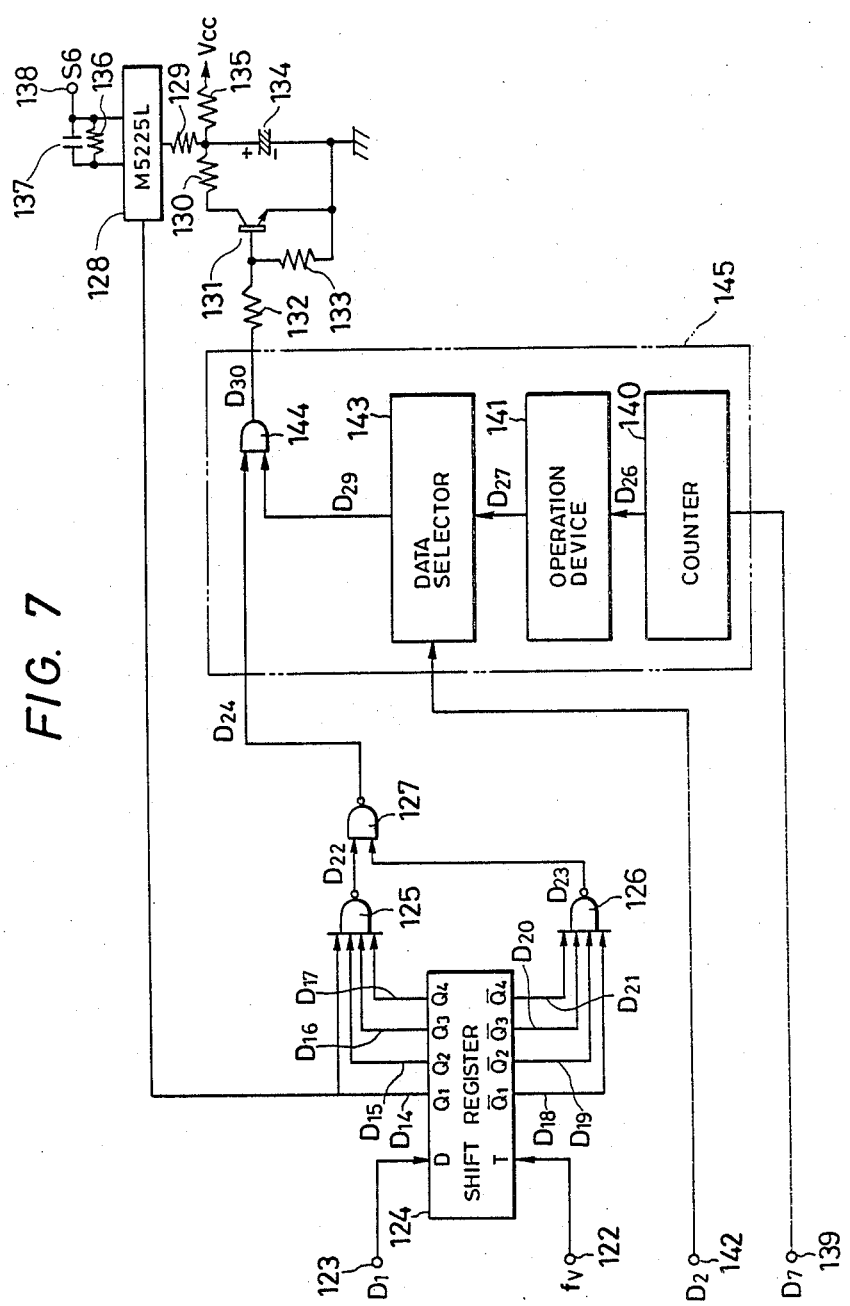
FIG. 7 is a diagram of an essential portion of the internal structure of the key converter of FIGS. 4 and 6.

FIG. 7 is a diagram of an essential portion of the key converter of FIG. 6. As shown in FIG. 7, an output signal D1 from the memory 104 (see FIG. 6) is applied to a data input terminal of a shift register 124 via a connection point 123. A latch clock signal fv derived from the variable-frequency clocks D7 is applied to a control terminal of the shift register 124 via a connection point 22. The shift register 124 has a set of four positive or non-inverting output terminals Q1–Q4 generating four signals D14–D17 respectively and a set of four negative or inverting output terminals $\overline{Q1}$–$\overline{Q4}$ generating four signals D18–D21 respectively. The output signals D14–D21 shift with respect to the output terminals at timings determined by the latch clock signal fv.

The output signals D14–D17 from the shift register 124 are applied to four input terminals of a NAND gate 125 respectively. The other output signals D18–D21 from the shift register 124 are applied to four input terminals of a NAND gate 126 respectively. An output signal D22 from the NAND gate 125 is applied to a first input terminal of a NAND gate 127. An output signal D23 from the NAND gate 126 is applied to a second input terminal of the NAND gate 127. An output signal D24 from the NAND gate 127 assumes a high or "1" level state only when all of the signals D14–D17 simultaneously assume the same state. Accordingly, only in the case where four or more successive signals D1 outputted from the memory 104 (see FIG. 6) are in the same state, the output signal D24 from the NAND gate 127 assumes a high or "1" level state. In this way, a syllable compander signal D24 is derived which is used to control adaptive operation. The adaptive control signal D24 is applied to the second input terminal of the AND gate 144.

The output signal D14 from the shift register 124 is applied to a data input terminal of a custom IC (for example, "M5225L" made by Mitsubishi Electric Corporation) 128 forming a digital-to-analog converter. The second pin of the IC 128 is grounded by a fixed resistor 129 and a capacitor 134. A constant voltage is applied to the junction between the resistor 129 and the capacitor 134 via a fixed resistor 135. The collector of a transistor 131 is connected via a fixed resistor 130 to the junction between the resistor 129 and the capacitor 134.

The emitter of the transistor 131 is grounded. The base of the transistor 131 is grounded via a fixed resistor 133. An output signal D30 from the AND gate 144 is applied to the base of the transistor 131 via a fixed resistor 132. A parallel combination of a fixed resistor 136 and a capacitor 137 is connected between the sixth pin and the seventh pin of the IC 128. The seventh pin of the IC 128 outputs a signal S6 which is applied via a connection point 138 to the adder 116 (see FIG. 6).

The D/A converter 105 (see FIG. 6) includes the shift register 124, the NAND gates 125–127, the IC 128, the transistor 131, the resistors 129, 130, 132, 133, 135, and 136, and the capacitors 134 and 137. The output digital signal D1 from the memory 104 (see FIG. 6) is converted into a corresponding analog signal S6 which is outputted via the connection point 138.

The variable-frequency clocks D7 are applied to the amplitude operation counter 140 via a connection point 139. The counter 140 derives an amplitude operation signal D26 from the variable-frequency clocks D7. The amplitude operation signal D26 is applied to the operation device 141. The operation device 141 derives a multi-bit digital signal D27 from the amplitude operation signal D26. The multi-bit signal D27 from the operation device 141 is applied to the first data selector 143. The fixed-frequency clocks D2 are applied to the first data selector 143 via a connection point 142. The device 143 sequentially selects one bit of the multi-bit digital signal D27 in accordance with the fixed-frequency clocks D2. The first data selector 143 outputs a signal D29 reflecting the selected data. The signal D29 is applied to the first input terminal of the AND gate 144.

While the adaptive operation control signal D24 remains in a high or "1" level state, the AND gate 144 is opened so that a high or "1" level pulse signal D29 from the first data selector 143 is allowed to move to the base of the transistor 131 as an output signal D30 from the AND gate 144. When the high level signal D30 is applied to the base of the transistor 131, the transistor 131 is made conductive, discharging the capacitor 134 and decreasing the voltage at the junction between the capacitor 134 and the resistor 129. A drop in the voltage at the junction between the capacitor 134 and the resistor 129 generally causes a decrease in the voltage of the analog signal S6. In this way, the amplitude of the output analog signal S6 is controlled in accordance with the signals D24 and D29. Specifically, the duration of the high or "1" level pulse D29 determines the amplitude of the output analog signal S6. The combination of the devices 140, 141, and 143 varies the duration of the high or "1" level pulse D29 in time-dependent manner so as to perform desired fade-in/fade-out control of the amplitude of the output analog signal S6.

The operation device 141 also generates a second multi-bit digital signal in accordance with the amplitude operation signal D26. The second multi-bit signal is applied to the second data selector 149 (see FIG. 6). The second multi-bit signal is generally similar to the multi-bit signal applied to the first data selector 143.

The combination of the second D/A converter 118 (see FIG. 6), the second data selector 149 (see FIG. 6), and the AND gate 150 (see FIG. 6) is similar to the combination of the first D/A converter 105, the first data selector 143, and the AND gate 144 except for the following point. The second data selector 149 sequentially selects one bit of the multi-bit signal from the operation device 141 in a reverse or opposite order with respect to the data selection order in the first data selector 143. Accordingly, the output analog signal S7 undergoes amplitude fade-in/fade-out control opposite that of the other output analog signal S6.

It should be noted that the key converter 5 of FIGS. 6 and 7 is one example, although it is not prior art. The key converter 5 may also be of any known types.

Figure 8:
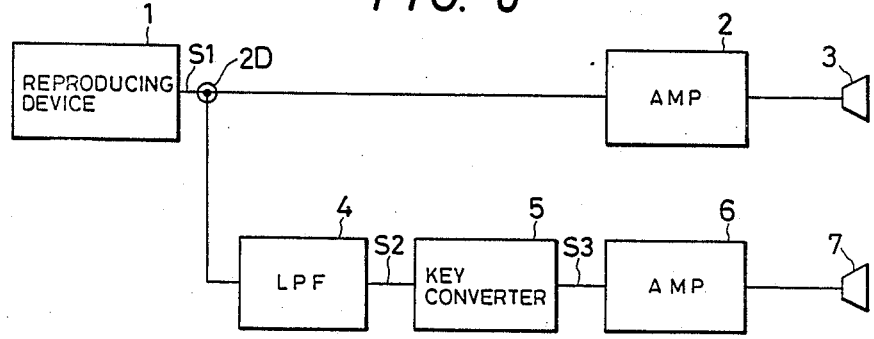
FIG. 8 is a block diagram of an audio system including a low-pitched sound creator according to a second embodiment of this invention.

FIG. 8 shows a second embodiment of this invention which is similar to the embodiment of FIGS. 4–7 except for the design changes indicated below.

The adder 8 (see FIG. 4) is omitted from this embodiment. The branching device 2D is directly coupled to the amplifier 2 so that the sound signal S1 from the reproducing device 1 is applied to the input terminal of the amplifier 2. Accordingly, the sound signal S1 is converted into a corresponding sound by the loudspeaker 3.

The output terminal of the key converter 5 is connected to an input terminal of an amplifier 6 so that the very-low-pitched sound signal S3 is applied to the amplifier 6. An output terminal of the amplifier 6 is connected to a loudspeaker 7, such as a woofer. After the very-low-pitched sound signal S3 is amplified by the device 6, it is converted by the loudspeaker 7 into a corresponding sound.

Figure 9:
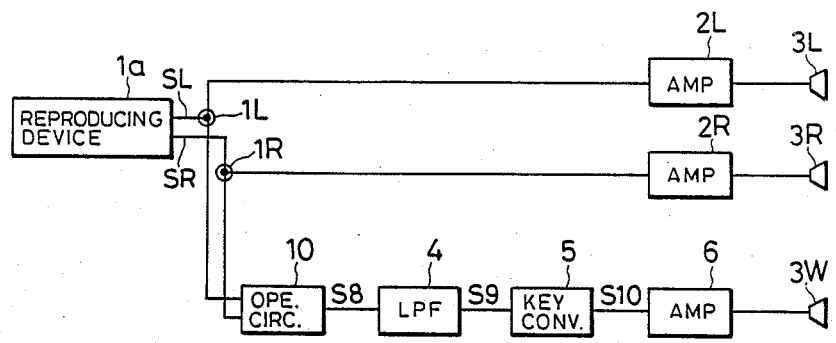
FIG. 9 is a block diagram of an audio system including a low-pitched sound creator according to a third embodiment of this invention.

FIG. 9 shows a third embodiment of this invention. As shown in FIG. 9, in this embodiment, a reproducing device 1a outputs a first channel signal SL and a second channel signal SR. A first channel output terminal of the reproducing device 1a is connected to an input terminal of a first branching device 1L so that the first channel signal SL is applied to the first branching device 1L. A second channel output terminal of the reproducing device 1a is connected to an input terminal of a second branching device 1R so that the second channel signal SR is applied to the second branching device 1R.

A first output terminal of the first branching device 1L is connected to an input terminal of an amplifier 2L. A second output terminal of the first branching device 1L is connected to a first input terminal of an operation or calculation circuit 10. The first channel signal SL from the reproducing device 1a is applied to the amplifier 2L and the operation circuit 10 via the first branching device 1L.

An output terminal of the amplifier 2L is connected to a loudspeaker 3L. After the branched first channel signal SL is amplified by the device 2L, it is converted by the loudspeaker 3L into a corresponding sound.

A first output terminal of the second branching device 1R is connected to an input terminal of an amplifier 2R. A second output terminal of the second branching device 1R is connected to a second input terminal of the operation circuit 10. The second channel signal SR from the reproducing device 1a is applied to the amplifier 2R and the operation circuit 10 via the second branching device 1R.

An output terminal of the amplifier 2R is connected to a loudspeaker 3R. After the branched second channel signal SR is amplified by the device 2R, it is converted by the loudspeaker 3R into a corresponding sound.

The operation circuit 10 includes a subtractor or difference calculator which outputs a signal S8 corresponding to a difference between the first channel signal SL and the second channel signal SR. The operation circuit 10 may include additional devices which adjust phases and levels of the two signals SL and SR so as to minimize the level of the output signal S8.

An output terminal of the operation circuit 10 is connected to an input terminal of a low-pass filter (LPF) 4 so that the signal S8 is applied to the low-pass filter 4. The low-pass filter 4 selects low-frequency components from the signal S8 and thereby derives a low-pitched signal S9 from the signal S8. A cut-off frequency of the low-pass filter 4 is preferably around 150 Hz.

An output terminal of the low-pass filter 4 is connected to an input terminal of a key or pitch converter 5 so that the output signal S9 from the low-pass filter 4 is applied to the key converter 5. The key converter 5 serves as a frequency lowering converter. Preferably, this device 5 converts the low-pitched signal S9 into a second low-pitched signal S10 having frequenies half the respective frequencies of the corresponding signal S9. In other words, the low-frequency components of the signal S8 selected by the low-pass filter 4 are lowered in frequency by a value corresponding to an octave. In this way, a very-low-pitched signal S10 is derived from the low-pitched signal S9.

It should be noted that the key converter 5 may decrease the frequencies of the low-pitched signal S9 by other factors. For example, the frequencies of the very-low-pitched signal S10 may be one-third or one-fourth of the respective frequencies of the low-pitched signal S9.

The key converter 5 is preferably similar to that of FIGS. 6 and 7. The key converter 5 may also be of known types.

An output terminal of the key converter 5 is connected to an input terminal of an amplifier 6 so that the very-low-pitched signal S10 is applied to the amplifier 6. An output terminal of the amplifier 6 is connected to a loudspeaker 3W such as a woofer or a super woofer. After the very-low-pitched signal S10 is amplified by the device 6, it is converted by the loudspeaker 3W into a corresponding sound.

It was experimentally found that if a sound signal having vocal or voice components was subjected to key down process, the resulting signal and the corresponding reproduced sound tended to be distorted. In general, the two channel signals SL and SR contain vocal or voice components at essentially the same level and the same phase. In view of these facts, subtraction between the two channel signals SL and SR is performed by the operation circuit 10 to derive a signal S8 essentially free from vocal or voice components. After this signal S8 is treated by the low-pass filter 4, it is subjected to key down process in the pitch converter 5. In this way, a signal essentially free from vocal components is subjected to key down process, so that the resulting signal and the corresponding reproduced sound less tend to be distorted.

Figure 10:
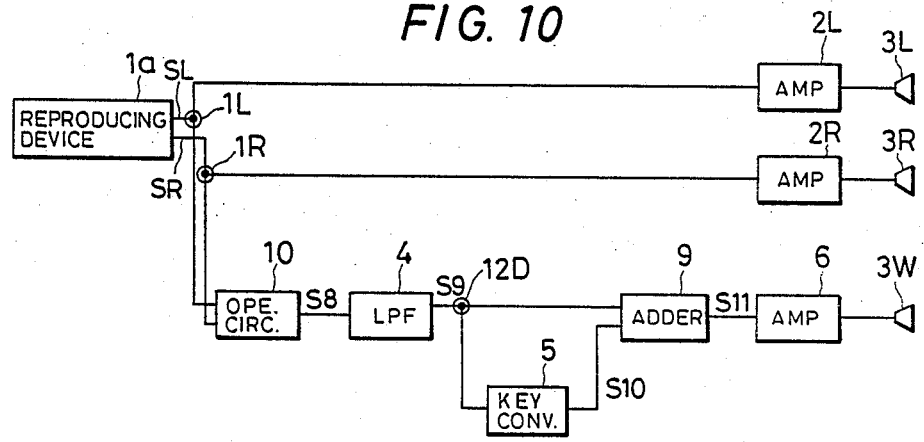
FIG. 10 is a block diagram of an audio system including a low-pitched sound creator according to a fourth embodiment of this invention.

FIG. 10 shows a fourth embodiment of this invention which is similar to the embodiment of FIG. 9 except for the following design changes.

As shown in FIG. 10, the output terminal of the low-pass filter 4 is connected to an input terminal of a branching device 12D. A first output terminal of the branching device 12D is connected to a first input terminal of an adder 9. A second output terminal of the branching device 12D is connected to the input terminal of the key converter 5. The output signal S9 from the low-pass filter 4 is applied to the first input terminal of the adder 9 and the key converter 5 via the branching device 12D. The output terminal of the key converter 5 is connected to a second input terminal of the adder 9 so that the output signal S10 from the key converter 5 is applied to the second input terminal of the adder 9.

In this way, one branched signal S9 bypasses the key converter 5, while the other branched signal S9 is subjected to key down process in the pitch converter 5. The key converter 5 derives the very-low-pitched signal S10 from the inputted branched signal S9. The very-low-pitched signal S10 and the branched signal S9 are added by the device 9 to form a signal S11.

An output terminal of the adder 9 is connected to the input terminal of the amplifier 6 so that the output signal S11 from the adder 9 is applied to the amplifier 6. After the signal S11 is amplified by the device 6, it is converted by the loudspeaker 3W into a corresponing sound.

Figure 11:
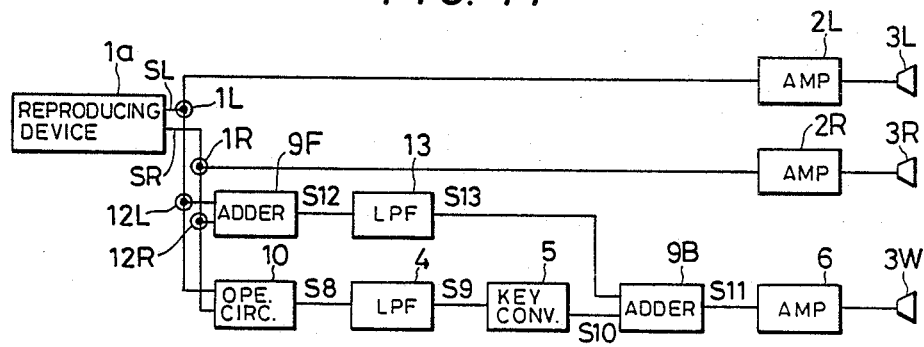
FIG. 11 is a block diagram of an audio system including a low-pitched sound creator according to a fifth embodiment of this invention.

FIG. 11 shows a fifth embodiment of this invention which is similar to the embodiment of FIG. 9 except for the following design changes.

As shown in FIG. 11, a branching device 12L is interposed between the branching device 1L and the first input terminal of the operation circuit 10. Specifically, an input terminal of the branching device 12L is connected to the branching device 1L so that the first channel signal SL is applied to the input terminal of the branching device 12L. A first output terminal of the branching device 12L is connected to the first input terminal of the operation circuit 10. A second output terminal of the branching device 12L is connected to a first input terminal of an adder 9F. The first channel signal SL is applied via the branching device 12L to the operation circuit 10 and the adder 9F.

Another branching device 12R is interposed between the branching device 1R and the second input terminal of the operation circuit 10. Specifically, an input terminal of the branching device 12R is connected to the branching device 1R so that the second channel signal SR is applied to the input terminal of the branching device 12R. A first output terminal of the branching device 12R is connected to the second input terminal of the operation circuit 10. A second output terminal of the branching device 12R is connected to a second input terminal of the adder 9F. The second channel signal SR is applied via the branching device 12R to the operation circuit 10 and the adder 9F.

The first channel signal SL and the second channel signal SR are added by the device 9F to form a signal S12. An output terminal of the adder 9F is connected to an input terminal of a low-pass filter (LPF) 13 so that the signal S12 is applied to the low-pass filter 13. The low-pass filter 13 selects low-frequency components from the signal S12 and thereby derives a low-pitched signal S13 from the signal S12.

An output terminal of the low-pass filter 13 is connected to a first input terminal of an adder 9B so that the low-pitched signal S13 from the low-pass filter 13 is applied to the first input terminal of the adder 9B. The adder 9B is interposed between the key converte 5 and the amplifier 6. The output terminal of the key converter 5 is connected to a second input terminal of the adder 9B so that the very-low-pitched signal S10 is applied to the second input terminal of the adder 9B. The low-pitched signal S13 and the very-low-pitched signal S10 are added by the device 9B to form a signal S11.

An output terminal of the adder 9B is connected to the input terminal of the amplifier 6 so that the signal S11 is applied to the amplifier 6. After the signal S11 is amplified by the device 6, it is coverted by the loudspeaker 3W into a corresponding sound.

FIG. 12 shows a sixth embodiment of this invention which is similar to the embodiment of FIG. 11 except for the following design changes. In the embodiment of FIG. 12, a branching arrangement 3D represents the combination of the branching devices 1L, 1R, 12L, and 12R (see FIG. 11).

The adder 9B (see FIG. 11) is omitted from the embodiment of FIG. 12. A switching circuit 11 and a level determination circuit 14 are added to the embodiment of FIG. 12.

As shown in FIG. 12, the switching circuit 11 is connected between the output terminal of the key converter 5 and the input terminal of the amplifier 6. When the switching circuit 11 is closed, the very-low-pitched signal S10 from the key converter 5 is allowed to travel to the input terminal of the amplifier 6. When the switching circuit 11 is opened, the application of the very-low-pitched signal S10 to the amplifier 6 is interrupted. The switching circuit 11 has a control terminal. The switching circuit 11 is closed and opened in accordance with a potential at its control terminal.

The output terminal of the low-pass filter 13 is connected to an input terminal of the level determination circuit 14 so that the output signal S13 from the low-pass filter 13 is applied to the level determination circuit 14. The level determination circuit 14 generates a binary signal S14 which depends on the amplitude of the input signal S13. Specifically, the signal S14 moves between a first level state and a second level state in accordance with whether or not the amplitude of the signal S13 exceeds a reference level. An output terminal of the level determination circuit 14 is connected to the control terminal of the switching circuit 11 so that the signal S14 from the level determination circuit 14 is applied to the control terminal of the switching circuit 11.

When the amplitude of the signal S13 exceeds the reference level, the signal S14 assumes a first level state, opening the switching circuit 11 and thereby interrupting the application of the very-low-pitched signal S10 to the amplifier 6. Accordingly, in this case, the very-low-pitched signal S10 is not converted into a sound.

When the amplitude of the signal S13 is equal to or lower than the reference level, the signal S14 assumes a second level, closing the switching circuit 11 and thereby applying the very-low-pitched signal S10 to the amplifier 6. Accordingly, in this case, the very-low-pitched signal S10 is converted into a corresponding sound by the loudspeaker 3W.

A cut-off frequency of the low-pass filter 13 is lower than the cut-off frequency of the low-pass filter 4. The cut-off frequency of the filter 13 is generally higher than half the cut-off frequency of the filter 4. In the case where the filters 4 and 13 have sharp frequency characteristics, the cut-off frequency of the filter 13 is preferably half the cut-off frequency of the filter 4.

The combination of the adder 9F, the low-pass filter 13, and the level determination circuit 14 essentially serves to determine whether or not at least one of the two channel signals SL and SR originally contains appreciable amounts of very-low-pitched sound components. When at least one of the two channel signals SL and SR originally contains appreciable amounts of very-low-pitched sound components, the switching circuit 11 is opened by the signal S14 from the level determination circuit 14 so that the very-low-pitched signal S10 derived through key down process is prevented from changing to a sound.

If at least one of the two channel signals SL and SR originally contained appreciable amounts of very-low-pitched sound components and the pitch-converted signal S10 containing created very-low-pitched sound components was changed to a sound, the original very-low-pitched sound components and the created very-low-pitched sound components would interfere with each other and thereby unacceptable distortions would occur. In this embodiment, such unacceptable distortions are prevented, since the conversion of the very-low-pitched signal S10 to a corresponding sound is interrupted when at least one of the two channel signals SL and SR originally contains appreciable amounts of very-low-pitched sound components.

FIG. 13 shows an internal design of the level deterxination circuit 14. As shown in FIG. 13, the level determination circuit 14 includes an input terminal 14A subjected to the signal S13 from the low-pass filter 13. The input terminal 14A is connected to an input terminal of an envelope detector or integrator 15 so that the signal S13 is applied to the device 15. The integrator 15 generates a signal S15 which depends on the amplitude of the input signal S13. Specifically, the signal S15 reflects an envelope of the signal S13. Accordingly, the level of the signal S15 corresponds to the amplitude of the signal S13. An output terminal of the integrator 15 is connected to a first input terminal of a comparator 16 so that the envelope signal S15 is applied to the first input terminal of the comparator 16. A level setting circuit 17 outputs a reference level signal S16. An output terminal of the level setting circuit 17 is connected to a second input terminal of the comparator 16 so that the reference level signal S16 is applied to the second input terminal of the comparator 16. The comparator 16 generates a binary signal S14 in accordance with the input signals S15 and S16. Specifically, when the level of the envelope signal S15 exceeds a reference level represented by the signal S16, the signal S14 assumes a first level state. When the level of the envelope signal S15 is equal to or lower than the reference level, the signal S14 assumes a second level state. An output terminal of the comparator 16 is connected to a connection point 14B leading to the control terminal of the switching circuit 11 (see FIG. 12). Accordingly, the output signal S14 from the comparator 16 is transmitted to the switching circuit 11 via the connection point 14B.

FIG. 14 shows a seventh embodiment of this invention which is similar to the embodiment of FIGS. 12 and 13 except for the following design changes.

As shown in FIG. 14, the output terminal of the low-pass filter 4 is connected to an input terminal of a branching device 12D. A first output terminal of the branching device 12D is connected to the input terminal of the key converter 5. A second output terminal of the branching device 12D is connected to a first input terminal of an adder 18. The output signal S9 from the low-pass filter 4 is applied via the branching device 12D to the key converter 5 and the first input terminal of the adder 18.

The output terminal of the key converter 5 is connected to a second input terminal of the adder 18 so that the very-low-pitched signal S10 from the key converter 5 is applied to the second input terminal of the adder 18. The low-pitched signal S9 from the low-pass filter 4 and the very-low-pitched signal S10 from the key converter 5 are added by the device 18 to form a signal S17. An output terminal of the adder 18 is connected to the input terminal of the switching circuit 11 so that the signal S17 is applied to the switching circuit 11. The switching circuit 11 enables and interrupts the application of the signal S17 to the amplifier 6 in accordance with the signal S14.

Figure 15:
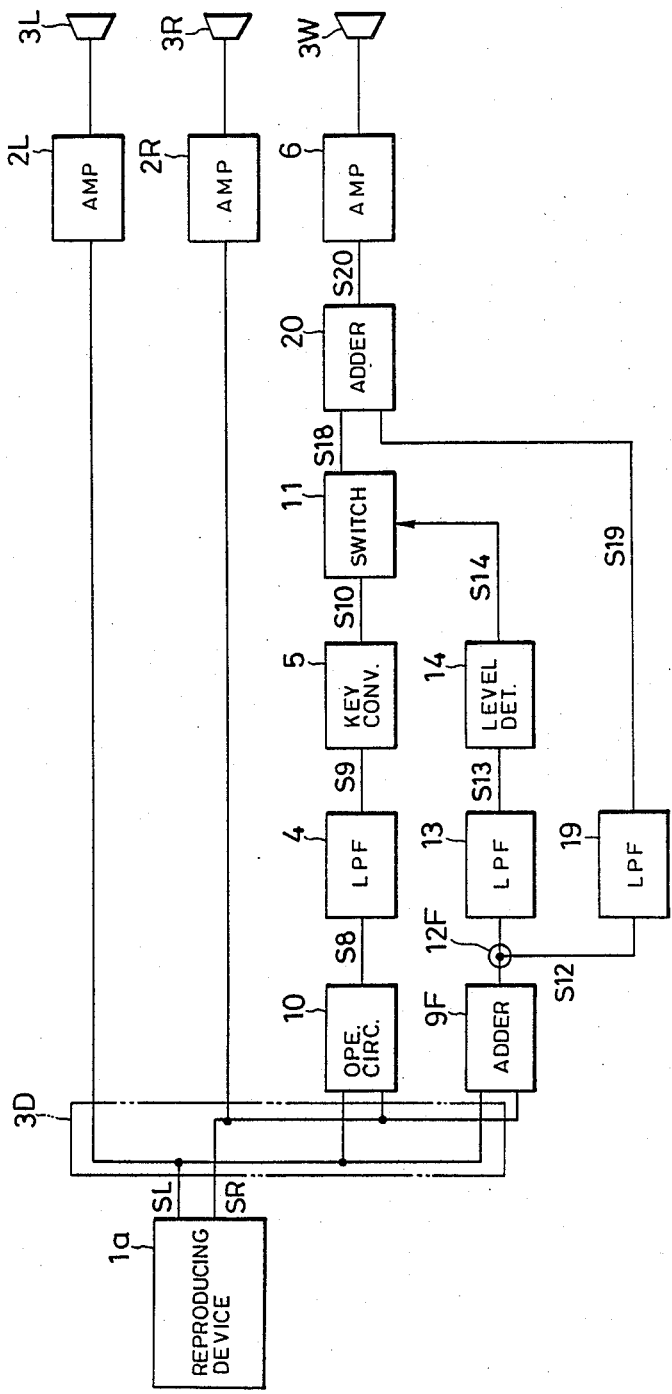
FIG. 15 is a block diagram of an audio system including a low-pitched sound creator according to an eighth embodiment of this invention.

FIG. 15 shows an eighth embodiment of this invention which is sixilar to the embodiments of FIGS. 12 and 13 except for the following desing changes.

As shown in FIG. 15, the output terminal of the adder 9F is connected to an input terxinal of a branching device 12F. A first output terminal of the branching device 12F is connected to the input terminal of the low-pass filter 13. A second output terminal of the branching device 12F is connected to an input terminal of a low-pass filter (LPF) 19. The output signal S12 from the adder 9F is applied via the branching device 12F to the low-pass filters 13 and 19. The low-pass filter 19 selects low-frequency components from the signal S12 and thereby a low-pitched signal S19 from the signal S12.

The output terminal of the switching circuit 11 is connected to a first input terminal of an adder 20 so that an output signal S18 from the switching circuit 11 is applied to the first input terminal of the adder 20. An output terxinal of the low-pass filter 19 is connected to a second input terminal of the adder 20 so that an output signal from the low-pass filter 19 is applied to the second input terminal of the adder 20. The signals S18 and S19 are added by the device 20 to form a signal S20. An output terminal of the adder 20 is connected to the input terminal of the amplifier 6 so that the signal S20 from the adder 20 is applied to the amplifier 6.

Figure 16:
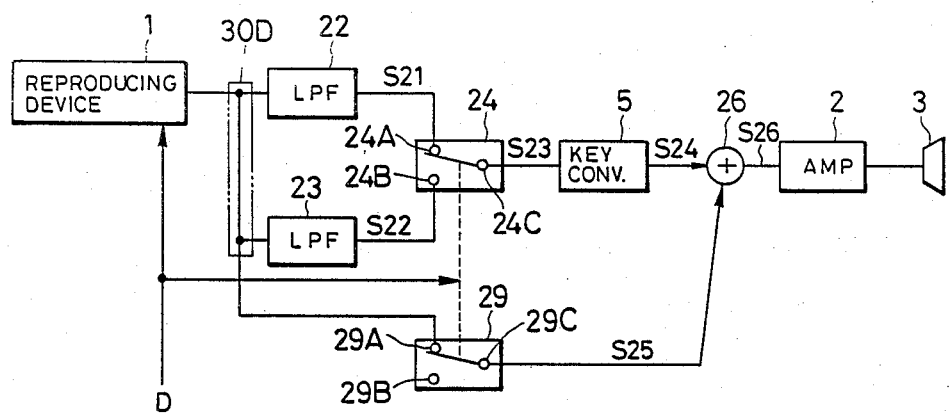
FIG. 16 is a block diagram of an audio system including a low-pitched sound creator according to a ninth embodiment of this invention.

FIG. 16 shows an audio system including a low-pitched sound creator according to a ninth embodiment of this invention. As shown in FIG. 16, the audio system has a reproducing device 1 such as a tape deck. The reproducing device 1 has a control terminal subjected to a binary control signal D. The reproducing device 1 assumes either of a normal speed state and a double speed state in accordance with the control signal D. The reproducing speed in the double speed state is twice the reproducing speed in the normal speed state.

The output terminal of the reproducing device 1 is connected to an input terminal of a branching device 30D so that the output signal S1 from the reproducing device 1 is applied to the branching device 30D. A first output terminal of the branching device 30D is connected to an input terminal of a low-pass filter (LPF) 22. A second output terminal of the branching device 30D is connected to an input terminal of a low-pass filter (LPF) 23. A third output terminal of the branching device 30D is connected to a first input terminal 29A of a switching circuit 29. The output sound signal S1 from the reproducing device 1 is applied via the branching device 30D to the low-pass filters 22 and 23, and the first input terminal 29A of the switching circuit 29.

The low-pass filter 22 selects low-frequency or low-pitched sound componentsfrom the sound signal S1 and thereby derives a low-pitched sound signal S21 from the signal S1. An output terminal of the low-pass filter 22 is connected to a first input terminal 24A of a switching circuit 24 so that the low-pitched sound signal S21 is applied to the first input terminal 24A of the switching circuit 24.

The low-pass filter 23 has a cut-off frequency higher than a cut-off frequency of the low-pass filter 22. The low-pass filter 23 selects audible-frequency or audio components from the sound signal S1 and thereby derives an audio signal S22 from the signal S1. An output terminal of the low-pass filter 23 is connected to a second input terminal 24B of the switching circuit 24 so that the audio signal S22 is applied to the second input terminal 24B of the swithcing circuit 24.

An output terminal 24C of the switching circuit 24 is connected to an input terminal of a key or pitch converter 5 so that an output signal S23 from the switching circuit 24 is applied to the key converter 5. The switching circuit 24 has a control terminal subjected to the binary control signal D. The switching circuit 24 passes either of the low-pitched signal S21 and the audio signal S22 to the key converter 5 in accordance with the control signal D.

The key converter 5 serves as a frequency lowering converter. In other words, the key converter 5 lowers the frequencies or pitches of the signal S23 outputted by the switching circuit 24 and selected from either of the low-pitched sound signal S21 and the audio signal S22. Specifically, this device 5 converts the signal S23 into a signal S24 having frequenies half the respective frequencies of the corresponding sound signal S23. In other words, the signal S23 is lowered in frequency by a value corresponding to an octave. In this way, a frequency-halved sound signal S24 is derived from the signal S23 outputted by the switching circuit 24.

The key converter 5 is preferably similar to that of FIGS. 6 and 7. The key converter 5 may also be of known types.

The switching circuit 29 has a control terminal subjected to the binary control signal D. The switching circuit 29 selectively passes and cuts off the sound signal S1 in accordance with the control signal D.

An output terminal 29C of the switching circuit 29 is connected to a first input terminal of an adder 26 so that an output signal S25 from the switching circuit 29 is applied to the first input terminal of the adder 26. An output terminal of the key converter 5 is connected to a second input terminal of the adder 26 so that the frequency-halved signal S24 is applied to the second input terminal of the adder 26. The signal S25 from the switching circuit 29 and the signal S24 from the key converter 5 are added by the device 26 to form a signal S26.

An output terminal of the adder 26 is connected to an input terminal of an amplifier 2 so that the signal S26 from the adder 26 is applied to the amplifier 2. An output terminal of the amplifier 2 is connected to a loudspeaker 3. After the signal S26 is amplified by the device 2, it is converted by the loudspeaker 3 into a corresponding sound.

When the binary control signal D is at a first level, the reproducing device 1 is in its normal speed state and the switching circuit 24 selects the low-pitched sound signal S21 and passes it to the key converter 5. Accordingly, a very-low-pitched sound signal S24 is created from the low-pitched sound signal S21 by the key converter 5. The very-low-pitched signal S24 is applied to the adder 26. At the same time, the switching circuit 29 passes the sound signal S1 to the adder 26. The very-low-pitched signal S24 and the sound signal S1 are added by the device 26 to form the resulting signal S26, which is amplified by the device 2 and is converted by the loudspeaker 3 into a corresponding sound. In this way, when the binary control signal D is at the first level, the reproducing device 1 operates at a normal speed and created very-low-pitched components are added to the reproduced sound.

When the binary control signal D is at a second level, the reproducing device 1 is in its double speed state and the switching circuit 24 selects the audio signal S22 and passes it to the key converter 5. Accordingly, a frequency-halved sound signal S24 is created from the audio signal S22 by the key converter 5. The frequency-halved signal S24 is applied to the adder 26. At the same time, the switching circuit 29 cuts off the transmission of the sound signal S1 to the adder 26. Accordingly, the output signal S26 contains only the frequency-halved signal S24, which is amplified by the device 2 and is converted by the loudspeaker 3 into a corresponding sound. In this way, when the binary control signal D is at the second level, the reproducing device 1 operates at a speed twice the normal speed and the audio signal S22 equal to an audible portion of the reproducing device output signal S1 is halved in frequency and is then converted into a corresponding sound so that the resulting reproduced sound has the same frequencies as those of an original sound.

Figure 17:
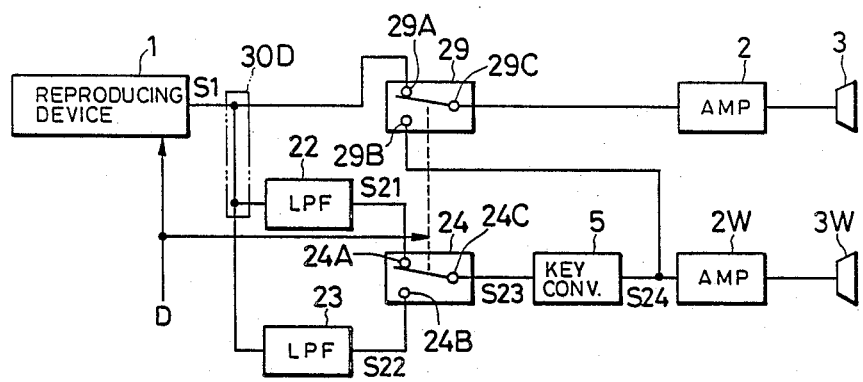
FIG. 17 is a block diagram of an audio system including a low-pitched sound creator according to a tenth embodiment of this invention.

FIG. 17 shows a tenth embodiment of this invention which is similar to the embodiment of FIG. 16 except for the following design changes.

As shown in FIG. 17, the adder 26 (see FIG. 16) is omitted from this embodiment. The output terminal 29C of the switching circuit 29 is connected to the input terminal of the amplifier 2. The output terminal of the key converter 5 is connected to a second input terminal 29B of the switching circuit 29 so that the output signal S24 from the key converter 5 is applied to the second input terminal 29B of the switching circuit 29. The switching circuit 29 passes either of the signals S1 and S24 to the amplifier 2 in accordance with the control signal D.

The output terminal of the key converter 5 is also connected to an input terminal of an amplifier 2W so that the output signal S24 from the key converter 5 is applied to the amplifier 2W. An output terminal of the amplifier 2W is connected to a loudspeaker 3W such as a woofer. The output signal S24 from the key converter 5 is amplified by the device 2W and is then converted by the loudspeaker 3W into a corresponding sound.

When the control signal D is at the first level, the switching circuit 29 passes the sound signal S1 to the amplifier 2 so that the sound signal S1 is converted by the loudspeaker 3 into a corresponding sound. At the same time, the key converter output signal S24 derived from the low-pitched sound signal S21 is converted by the loudspeaker 3W into a corresponding sound.

When the control signal D is at the second level, the switching circuit 29 passes the key converter output signal S24 to the amplifier 2 so that the signal S24 is converted by the loudspeaker 3 into a corresponding sound. At the same time, the key converter output signal S24 is also converted by the loudspeaker 3W into a corresponding sound.

Figure 18:
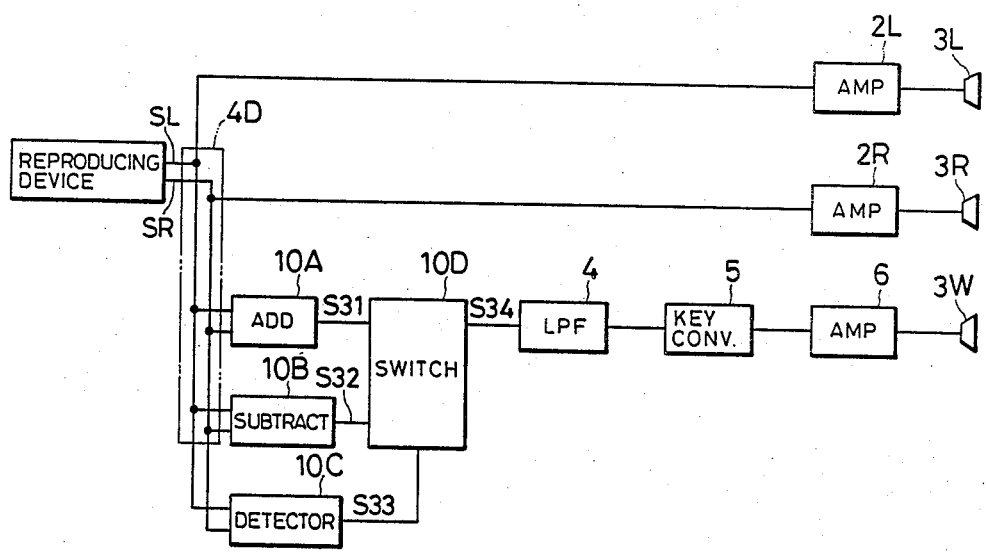
FIG. 18 is a block diagram of an audio system including a low-pitched sound creator according to an eleventh embodiment of this invention.

FIG. 18 shows an eleventh embodiment of this invention which is similar to the embodiment of FIG. 9 except for the following design changes.

In the embodiment of FIG. 18, the branching devices 1L and 1R (see FIG. 9) are included in a branching arrangement 4D. The first channel signal SL outputted by the reproducing device 1 is applied to the amplifier 2L via the branching arrangement 4D. The second channel signal SR outputted by the reproducing device 1 is applied to the amplifier 2R via the branching arrangement 4D.

The first channel signal SL is also applied via the branching arrangement 4D to a first input terminal of an adder 10A, a first input terminal of a subtractor 10B, and a first input terminal of a detector 10C. The second channel signal SR is also applied via the branching arrangement 4D to a second input terminal of the adder 10A, a second input terminal of the subtractor 10B, and a second input terminal of the detector 10C.

The device 10A adds the two channel signals SL and SR to form a signal S31. The device 10B derives a difference or subtraction between the two channel signals SL and SR to form a signal S32. The device 10C detects whether or not the signals SL and SR contain vocal or voice components. The detector 10C outputs a binary signal S33 which moves between two level states in accordance with whether or not the signals SL and SR contain vocal or voice components.

An output terminal of the adder 10A is connected to a first input terminal of a switching circuit 10D so that the output signal S31 from the adder 10A is applied to the first input terminal of the switching circuit 10D. An output terminal of the subtractor 10B is connected to a second input terminal of the switching circuit 10D so that the output signal S32 from the subtractor 10B is applied to the second input terminal of the switching circuit 10D. An output terminal of the detector 10C is connected to a control terminal of the switching circuit 10D so that the output signal S33 from the detector 10C is applied to the control terminal of the switching circuit 10D. The switching circuit 10D selectively passes either of the signals S31 and S32 in accordance with the signal S33. An output terminal of the switching circuit 10D is connected to the input terminal of the low-pass filter 4 so that an output signal S34 from the switching circuit 10D is applied to the low-pass filter 4.

When the signals SL and SR do not contain any vocal or voice components, the binary signal S33 outputted by the detector 10C assumes a low level state so that the switching circuit 10D passes the adder output signal S31 to the low-pass filter 4. Accordingly, in this case, low-frequency components of the adder output signal S31 are selected by the low-pass filter 4 and are then lowered in pitch by the key converter 5 before they are converted by the loudspeaker 3W into a corresponding sound.

When the signals SL and SR contain vocal or voice components, the binary signal S33 outputted by the detector 10C assumes a high level state so that the switching circuit 10D passes the subtractor output signal S32 to the low-pass filter 4. Accordingly, in this case, low-frequency components of the subtractor output signal S32 are selected by the low-pass filter 4 and are then lowered in pitch by the key converter 5 before they are converted by the loudspeaker 3W into a corresponding sound. In general, vocal or voice components are contained in the signals SL and SR at essentially the same levels and phases. Accordingly, these vocal or voice components are cancelled by the subtractor 10B so that the subtractor output signal S32 is essentially free from the vocal or voice components. In this way, when the signals SL and SR contain vocal or voice components, the corresponding vocal or voice components are removed from the signal subjected to key down process in the key converter 5. It should be noted that vocal or voice components would tend to cause distorsions in the reproduced sound if they were subjected to the key down process.

The loudspeaker 3W and the amplifier 5 may be omitted from the embodiment of FIG. 18. In this case, the output signal from the key converter 5 is added to each of the signals SL and SR, and the resulting two signals are amplified by the devices 2L and 2R and are then converted by the loudspeakers 3L and 3R into corresponding sounds respectively.

Figure 19:
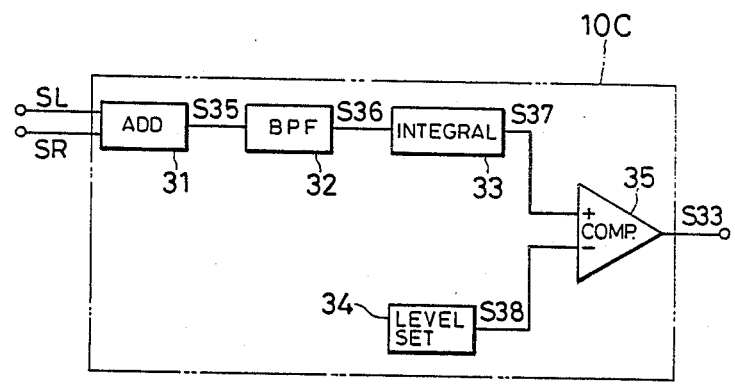
FIG. 19 is a block diagram of an internal structure of the detector of FIG. 18.

FIG. 19 shows an internal structure of the detector 10C. As shown in FIG. 19, the detector 10C includes an adder 31. The first channel signal SL is applied to a first input terminal of the adder 31. The second channel signal SR is applied to a second input terminal of the adder 31. The two channel signals SL and SR are added by the device 31 to form a signal S35. An output terminal of the adder 31 is connected to an input terminal of a band-pass filter (BPF) 32 so that the output signal S35 from the adder 31 is applied to the band-pass filter 32. The band-pass filter 32 selects fundamental vocal frequency components from the signal S35 and thereby derives the vocal frequency signal S36 from the signal S35. Specifically, the band-pass filter 32 selects components having frequencies in the range of approximately 90–800 Hz. An output terminal of the band-pass filter 32 is connected to an input terminal of an integrator 33 so that the vocal frequency signal S36 is applied to the integrator 33. This device 33 integrates the vocal frequency signal S36 at a large time constant and thereby derives an integrated signal S37 from the vocal frequency signal S36. When the signals SL and SR contain vocal components, the voltage of the output signal S37 from the integrator 33 exceeds a certain level. When the signals SL and SR do not contain any vocal components, the voltage of the output signal S37 from the integrator 33 is essentially zero. An output terminal of the integrator 33 is connected to a first input terminal of a comparator 35 so that the output signal S37 from the integrator 33 is applied to the first input terminal of the comparator 35. A voltage setting circuit 34 generates a reference signal S38 having a preset constant voltage. An output terminal of the voltage setting circuit 34 is connected to a second input terminal of the comparator 35 so that the reference voltage signal S38 is applied to the second input terminal of the comparator 35. When the level of the output signal S37 from the integrator 33 exceeds the reference level S38, the comparator 35 outputs a high level signal S33. When the level of the output signal S37 from the integrator 33 does not exceed the reference level S38, the comparator 35 outputs a low level signal S33. An output terminal of the comparator 35 is connected to the control terminal of the switching circuit 10D (see FIG. 18) so that the output signal S33 from the comparator 35 is applied to the control terminal of the switching circuit 10D. In this way, when the signals SL and SR contain vocal components, the output signal S33 from the detector 10C assumes a high level state. When the signals SL and SR do not contain any vocal components, the output signal S33 from the detector 10C assumes a low level state.

What is claimed is:
1. A low-pitched sound creator comprising:
   (a) means for deriving two channel analog sound signals;
   (b) a low-pass filter selecting low-frequency components from at least one of the analog sound signals and deriving a low-pitched sound signal representing the selected low-frequency components;
   (c) means for lowering a key of the low-pitched sound signal and thereby deriving a very low- pitched sound signal from the low-pitched sound signal;

(d) means for adding the two channel signals to form a mixed signal;

(e) a second low-pass filter selecting low-frequency components from the mixed signal and thereby deriving a second low-pitched sound signal representing the selected low-frequency components; and (f) means for adding the second low-pitched sound signal and the very low-pitched sound signal to form a processed low-pitched sound signal.

2. A low-pitched sound creator comprising:

(a) means for deriving two channel analog sound signals;

(b) a low-pass filter selecting low-frequency components from at least one of the analog sound signals and deriving a low-pitched sound signal representing the selected low-frequency components;

(c) means for lowering a key of the low-pitched sound signal and thereby deriving a very low-pitched sound signal from the low-pitched sound signal;

(d) means for deriving a subtraction between the two channel signals and generating a subtraction signal indicative thereof;

(e) means for adding the two channel signals to form a mixed signal;

(f) first and second sub low-pass filters included in the low-pass filter, the first sub low-pass filter selecting low-frequency components from the subtraction signal and thereby deriving a first sub low-pitched sound signal representing the selected low-frequency components of the subtraction signal, the second sub low-pass filter selecting low-frequency components from the mixed signal and thereby deriving a second sub low-pitched sound signal representing the selected low-frequency components of the mixed signal, the key-lowering means being operative to lower a key of the first sub low-pitched sound signal to form the very low-pitched sound signal;

(g) means for converting the very low-pitched sound signal into a corresponding sound;

(h) means for detecting an envelope of the second sub low-pitched sound signal; and (i) means for selectively enabling and interrupting the conversion of the very low-pitched sound signal into the corresponding sound in accordance with whether or not a level of the envelope exceeds a reference level.

3. The sound creator of claim 2 further comprising means for adding the first sub low-pitched sound signal and the very-low-pitched sound signal to form a processed low-pitched sound signal.

4. The sound creator of claim 2 wherein the enabling-/interrupting means includes a switching circuit selectively allowing and inhibiting transmission of the very-low-pitched sound signal to the converting means, and further comprising a third low-pass filter selecting low-frequency components from the mixed signal and thereby deriving a third low-pitched sound signal representing the selected low-frequency components of the mixed signal, and means for adding the third low-pitched sound signal to a signal outputted from the switching circuit to the converting means.

5. A low-pitched sound creator comprising:

(a) means for deriving two channel analog sound signals;

(b) a low-pass filter selecting low-frequency components from at least one of the analog sound signals and deriving a low-pitched sound signal representing the selected low-frequency components;

(c) means for lowering a key of the low-pitched sound signal and thereby deriving a very low-pitched sound signal from the low-pitched sound signal;

(d) means for deriving a subtraction between the two channel signals and generating a subtraction signal indicative thereof;

(e) means for adding the two channel signals to form a mixed signal;

(f) means for detecting whether or not the two channel signals contain voice components; and (g) means for selectively passing either fo the subtraction signal or the mixed signal to the low-pass filter in accordance with whether or not the two channel signals contain voice components.

6. The sound creator of claim 5 wherein the detecting means comprises means for adding the two channel signals to form a second mixed signal, a band-pass filter selecting components in a preset frequency band from the second mixed signal and generating a band-pass signal representing the selected components, the preset frequency band corresponding to a fundamental frequency range of voice components, means for integrating the band-pass signal and thereby deriving an integral signal from the band-pass signal, and means for comparing the integral signal and a reference level.

7. A low-pitched sound creator comprising:

(a) means for outputting two channel sound signals;

(b) means for deriving a subtraction between the two channel signals and thereby generating a subtraction signal indicative thereof;

(c) means for adding the two channel signals to form a mixed signal;

(d) a first low-pass filter selecting low-frequency components from the subtraction signal and thereby generating a first low-pitched sound signal representing the selected low-frequency components of the subtraction signal;

(e) a second low-pass filter selecting low-frequency components from the mixed signal and thereby generating a second low-pitched sound signal representing the selected low-frequency components of the mixed signal;

(f) means for lowering a key of the first low-pitched sound signal and thereby deriving a very-low-pitched sound signal from the first low-pitched sound signal;

(g) means for detecting an envelope of the second low-pitched sound signal; and (h) means for selectively passing and cutting off the very-low-pitched sound signal in accordance with the detected envelope.

8. A low-pitched sound creator comprising:

(a) means for outputting two channel sound signals;

(b) means for deriving a subtraction between the two channel signals and thereby generating a subtraction signal indicative thereof;

(c) means for adding the two channel signals to form a mixed signal;

(d) means for detecting whether or not the two channel signals contain voice components;

(e) means for selecting an arbitrary one of the subtraction signal and the mixed signal in accordance with whether or not the two channel signals contain voice components and thereby generating a selected signal representing the selected one of the subtraction signal and the mixed signal;
(f) a low-pass filter selecting low-frequency components from the selected signal and thereby generating a low-pitched sound signal representing the selected low-frequency components; and
(g) means for halving a key of the low-pitched sound signal and thereby deriving a very-low-pitched sound signal from the low-pitched sound signal.

* * * * *